United States Patent [19]

Parrens

[11] Patent Number: 4,620,893

[45] Date of Patent: Nov. 4, 1986

[54] APPARATUS FOR THE PLASMA TREATMENT OF DISK-SHAPED SUBSTRATES

[75] Inventor: Pierre Parrens, Grenoble, France

[73] Assignee: Nextral, Meylan, France

[21] Appl. No.: 711,534

[22] PCT Filed: Jul. 5, 1984

[86] PCT No.: PCT/FR84/00167

§ 371 Date: Feb. 28, 1985

§ 102(e) Date: Feb. 28, 1985

[87] PCT Pub. No.: WO85/00466

PCT Pub. Date: Jan. 31, 1985

[30] Foreign Application Priority Data

Jul. 5, 1983 [FR] France .................. 83 11183

[51] Int. Cl.$^4$ .......................... B44C 1/22; C03C 15/00; C23F 1/02; H01L 21/306
[52] U.S. Cl. .................... 156/345; 156/643; 156/646; 204/298
[58] Field of Search ............ 156/345, 643, 646; 204/298, 192 E; 118/728, 50.1, 620; 427/38, 39

[56] References Cited

U.S. PATENT DOCUMENTS 4,399,016 8/1983 Tsukada et al. ............... 156/345 X
4,473,455 9/1984 Dean et al. ................... 156/345 X

FOREIGN PATENT DOCUMENTS 2703659 8/1977 Fed. Rep. of Germany .
2014500 8/1979 United Kingdom .
2026369 2/1980 United Kingdom .

OTHER PUBLICATIONS

Patents Abstracts of Japan, vol. 7, No. 171(C-178, 1316), Jul. 28, 1983, Jp. No. 58-77568(A), 5/10/1983, Hitachi Seisakusho K.K. (Hiraiwa).
Patents Abstracts of Japan, vol. 7, No. 53(C-154, 1198), 3/3/1983, Jp. No. 57-203779(A), 12/14/1982, Fujitsu K.K. (Maruyama).

Primary Examiner—William A. Powell
Attorney, Agent, or Firm—Beveridge, DeGrandi & Weilacher

[57] ABSTRACT

An apparatus for plasma treatment of plate-shaped substrates comprises a reaction vessel (2) provided with supply opening (48) and discharge opening (50) for a reaction gas. Anode (46) and a plurality of cathodes (13) are also provided. At the periphery of the cathodes (13) are provided gas flow passges (40, 41) through which the reaction gas may flow from the gas supply opening (48). The gas flow passages (40, 41) are provided on the side of surfaces (15c, 16c) of the cathodes receiving small plates. Discharge opening (50) is arranged downstream of gas flow passages (40, 41). The apparatus may also comprise a removable tray (38) to load and unload the small plates, and the flow passages (40, 41) may be delimited by the walls of the electrodes and of passages traversing the tray (38).

17 Claims, 6 Drawing Figures

APPARATUS FOR THE PLASMA TREATMENT OF DISK-SHAPED SUBSTRATES

The present invention relates to an apparatus for the plasma treatment of disk-shaped substrates and in particular to an etching apparatus.

According to the present state of the art, a plasma treatment machine is known, which comprises a cathode in the form of a column, at the periphery of which the substrates to be treated can be arranged and around and at a distance from which a cylindrical container forming an anode and delimiting the reaction vessel can be arranged. In this machine, the reaction gas is introduced by means of pipes which extend in the space separating the central column forming an anode from the cylindrical cover and is discharged at one of the ends of this space. Because of this structure, the flow inside the reaction gas vessel is not uniform for all the substrates and this results, for certain applications, in insufficiently homogeneous treatment of each substrate and insufficiently homogeneous treatment of the substrates compared to each other. Moreover, loading and unloading of the substrates on/from the column forming a cathode is particularly complicated on account of the fact that the substrates must be loaded and unloaded in vertical rows.

A plasma treatment machine is also known, which comprises a ring forming a cathode on which the substrates to be treated can be arranged. Injection of the reaction gas is performed at the periphery of the ring whereas pumping is performed in the center of this ring. This machine has the disadvantage of occupying a large volume in relation to the number of substrates which can be treated and, taking into account the direction of flow of the reaction gas, the substrates are not treated in a sufficiently homogeneous manner.

Moreover, in the first machine as in the second machine, the plasma ignites over the entire surface of the substrates and also over the entire surface of the cathode. This results in a high consumption of electrical energy.

The present invention is aimed in particular at overcoming the drawbacks of the present state of the art and proposes a plasma treatment apparatus which ensures very good directivity, selectivity and homogeneity of treatment for each of the substrates and for the substrates compared to each other.

The apparatus, according to the present invention, for the plasma treatment of disk-shaped substrates comprises a reaction vessel which has supply means and discharge means for a reaction gas, at least one first electrode, forming an anode, which is provided in the said vessel and is designed to be connected to a reference potential and, located in the said vessel, at least one second electrode, forming a cathode, which is electrically insulated from the said first electrode and is designed to be connected to an alternating energy source and has a surface for receiving at least one substrate located on the same side as the said first electrode, so that a plasma can be formed between the said electrodes with a view to treating the substrate carried by the second electrode. The treatment apparatus according to the present invention is such that it comprises a plurality of cathodes, at the periphery of which are provided, in each case, gass flow spaces through which the reaction gas is able to flow, from the gas supply means located on the same side as the cathode surfaces for receiving the plates, to the gas discharge means located downstream of these flow spaces.

According to the present invention, the said cathodes may advantageously be, in each case, surrounded at a distance by parts which are electrically insulated from the cathodes and connected to the reference potential, the said flow spaces being provided between these parts and the peripheral walls of the corresponding cathodes.

The treatment apparatus according to the present invention may advantageously comprise at least one removable support which has a plurality of through passages formed so as to correspond to at least one part of the said cathodes and provided with means for holding, in each case, at least one substrate inside the said passages or opposite thereto, this removable support being designed to be mounted inside the said reaction vessel in such a way that the substrates which it carries rest, in each case, on the receiving surfaces of the corresponding cathodes.

According to the present invention, the said removable support may be designed so that the walls of its through passages extend at the periphery of and at a distance from the corresponding cathodes in such a way that the said reaction gas flow spaces are provided between the walls of the said passages and the peripheral walls of the corresponding cathodes.

According to the present invention, the said removable support, when mounted, can advantageously be electrically insulated from the said cathodes and from the said substrates which the latter carry and can be advantageously connected to the reference potential.

As a result, the removable support provided above can be used for simultaneously loading and unloading several substrates in/from the said reaction vessel and may also form, around the cathodes, a screen which allows the plasma to ignite only above the cathodes and therefore above the substrates which the latter carry.

According to the present invention, the said cathodes may be provided, in each case, with internal channels, inside which a cooling fluid is able to flow, the respective internal channels of the said cathodes being preferably connected in parallel to an external cooling circuit.

According to the present invention, screens which are electrically insulated from the said cathodes may be provided around the parts of these cathodes which extend below their substrate-receiving surfaces and may be connected to the reference potential in such a way that no plasma is formed below the substrate-receiving surface of the cathodes.

According to the present invention, the said reaction gas supply means inside the said reaction vessel may comprise means for conveying the reaction gas opposite each of the said cathodes and opposite their substrate-receiving surfaces. In a particularly advantageous manner, these means for conveying the reaction gas opposite each of the said cathodes may advantageously comprise a gas inlet orifice located opposite the center of their substrate-receiving surface.

According to the present invention, the said anode may advantageously extend opposite and at a distance from the receiving surfaces of the cathodes, it thus being possible for the reaction gas supply means to comprise advantageously at least one chamber formed inside this anode and communication orifices which are located between this internal chamber and the inside of the said reaction vessel and opposite each of the said cathodes.

In a particularly simple variation of embodiment, the apparatus, according to the present invention, for the plasma treatment of disk-shaped substrates may advantageously comprise a plurality of cathodes which have substrate-receiving surfaces extending in the same plane and which are located at a distance from each other, these cathodes dividing the said vessel into a first chamber located on the same side as their substrate-receiving surfaces and a second chamber which is located on the other side and inside which they extend, the said reaction gas supply means emerging inside the said first chamber and the said reaction gas discharge means communicating with the said second chamber, in such a way that the reaction gas is able to flow through the spaces separating the said cathodes.

In this variation, the treatment apparatus according to the present invention may advantageously comprise a removable plate which has a plurality of through passages formed so as to correspond to the said cathodes and provided with means for holding, in each case, substrates inside the said passages, this plate being designed to be arranged or mounted in the said reaction vessel in such a way that the substrates which it carries rest on the substrate-receiving surfaces of the corresponding cathodes and that the reaction gas flow spaces extend, in each case, between the peripheral wall of the said cathodes and the wall of the said corresponding through passages.

According to the present invention, the said means for holding the substrates inside the said passages of the said plate may advantageously consist of plugs forming supports for the substrates and holding the substrates at a distance from the walls of the said through passages.

According to the present invention, the said removable plate is preferably electrically insulated from the said cathodes and from the said substrates. For this purpose, it is particularly advantageous if the said support plugs which form the means for holding the substrates inside the said passages are made of an electrically insulating material.

According to the present invention, the ends of the said cathodes opposite their substrate-receiving surfaces may be connected to each other by a plate in which two chambers are provided, one of which is provided with cooling fluid supply means and the other of which is provided with cooling fluid discharge means, the said cathodes having internal cooling channels connected, in each case, in parallel to these two chambers.

According to the present invention, the said anode may advantageously consist of a plate arranged inside the said first chamber and opposite the said cathodes at a distance, the said reaction gas supply means comprising a chamber formed inside this plate and a plurality of orifices emerging opposite the said cathodes.

According to the present invention, it is particularly advantageous if the said anode plate comprises orifices emerging opposite the middle of the substrate-receiving surfaces of the cathodes.

The present invention will be better understood by examining particular apparatus for the plasma treatment of disk-shaped substrates, described by way of non-limiting examples and illustrated in the drawing in which.

Figure 1:
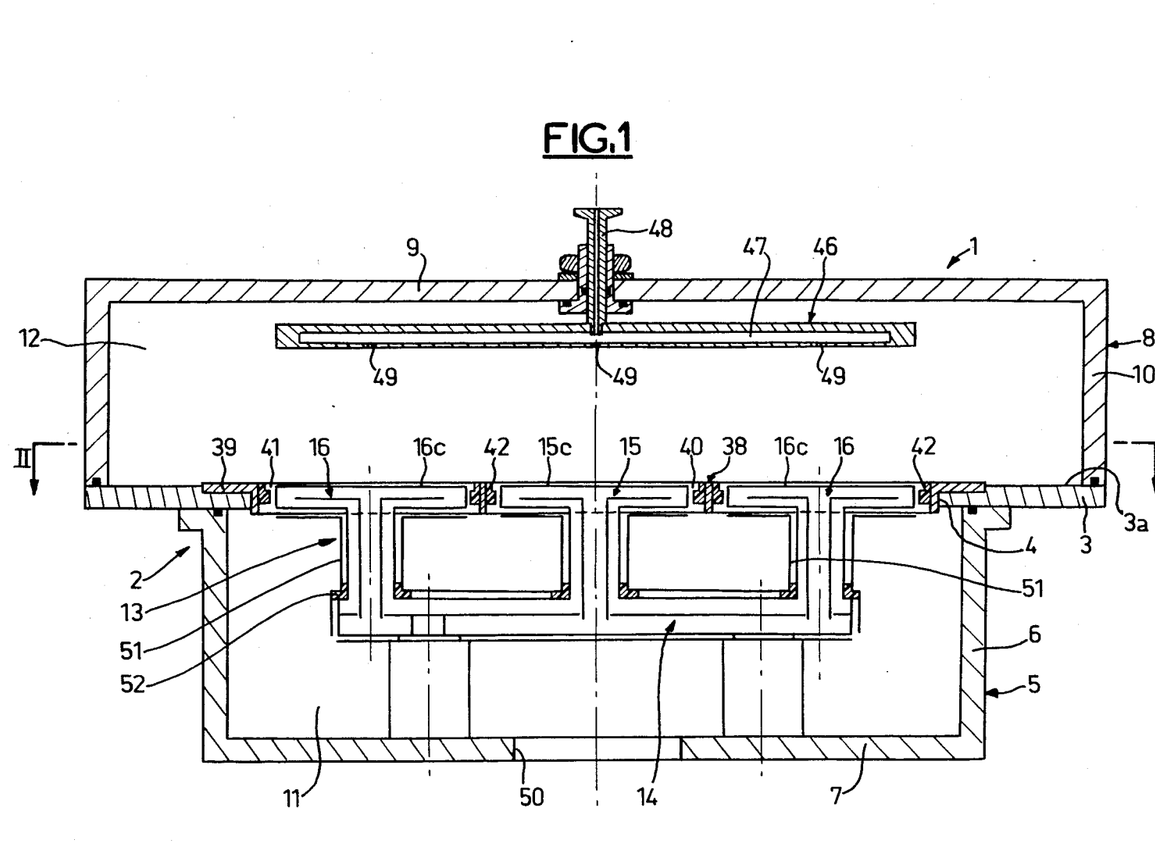
FIG. 1 shows an axial section in elevation, along the line I—I in FIG. 2 of a first treatment apparatus, this section showing a diagrammatic view.
Figure 2:
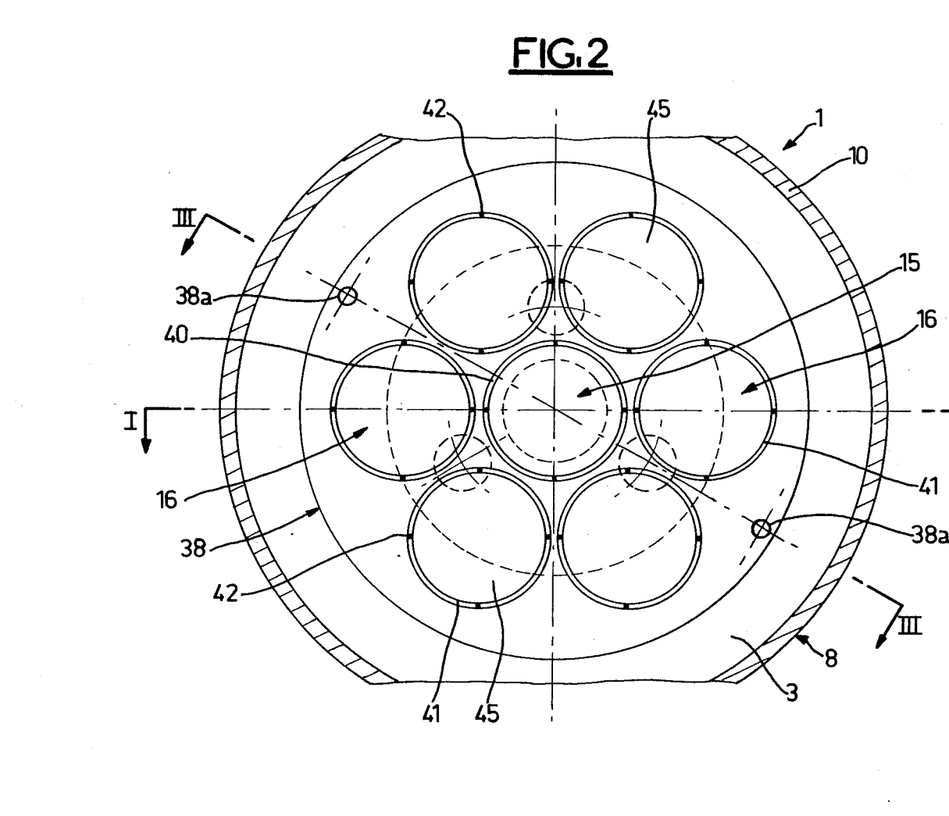
FIG. 2 shows a section, along the line II—II, of the treatment apparatus shown in diagrammatic form in FIG. 1.

As can be seen in particular in FIG. 1, the plasma treatment apparatus, indicated generally by the reference number 1, comprises a reaction vessel, indicated generally by the reference number 2, which is connected to ground.

This reaction vessel 2 comprises a horizontal circular ring 3, in the center of which a circular opening 4 is provided, a bowl-shaped cover 5 which has a cylindrical wall 6 whose end is fixed to the internal surface of the ring 3 and a horizontal bottom 7 which is located at a distance from the ring 3, as well as a cover 8 opposite the bell-shaped cover, the horizontal wall 9 of which is located at a distance from the plate 3 and the cylindrical wall 10 of which rests on the peripheral edge of the upper surface 3a of the ring 3, it being possible to remove this cover 8 so as to provide access to the interior of the vessel 2 and to fix it on the ring 3, in the position shown, using known means not shown.

Consequently, the cover 5 defines a lower chamber 11 and the cover 8 defines an upper chamber 12.

The reaction vessel 2 has inside it an assembly of electrodes forming cathodes, which assembly is indicated generally by the reference number 13 and is arranged as follows.

This electrode assembly 13 comprises a plate 14 which extends horizontally inside the lower chamber 11 and is supported by the wall 7 of the cover 5, as will be seen below. The electrode assembly 13 also comprises a central electrode 15 as well as six electrodes 16 arranged at the periphery of the central electrode 15, these electrodes 15 and 16 extending upwards from the plate 14.

The central electrode 15 and the six electrodes 16 are constructed in the same manner. They have at the top, respectively, a cylindrical part in the form of a disk, 15a and 16a, and a cylindrical part 15b and 16b connecting the disk 15a and 16a to the plate 14 and with a diameter less than that of the disk 15a and 16a. The disks 15a and 16a have upper surfaces 15c and 16c which lie in the same plane and extend substantially in the plane of the upper surface 3a of the ring 3. Moreover, the disks 15a and 16a are arranged substantially at the same distance from each other and the disks 16a of the peripheral electrodes 16 are located at a distance from the wall of the ring 3 forming the opening 4, in such a way that spaces connecting the upper chamber 12 to the lower chamber 11 are provided between the electrodes 15 and 16 and the ring 3.

The electrode assembly 13 rests on three feet 17, 18 and 19 which extend between the plate 14 and the wall 7 of the cover 5 and which are cylindrical in shape, the upper end of these feet being electrically insulated from the plate 14 by means of collars made of an insulating material. It can be seen, for example, in FIG. 3 that the collar (sic) 19 is electrically insulated from the plate 14 by means of a collar 19a.

Figure 3:
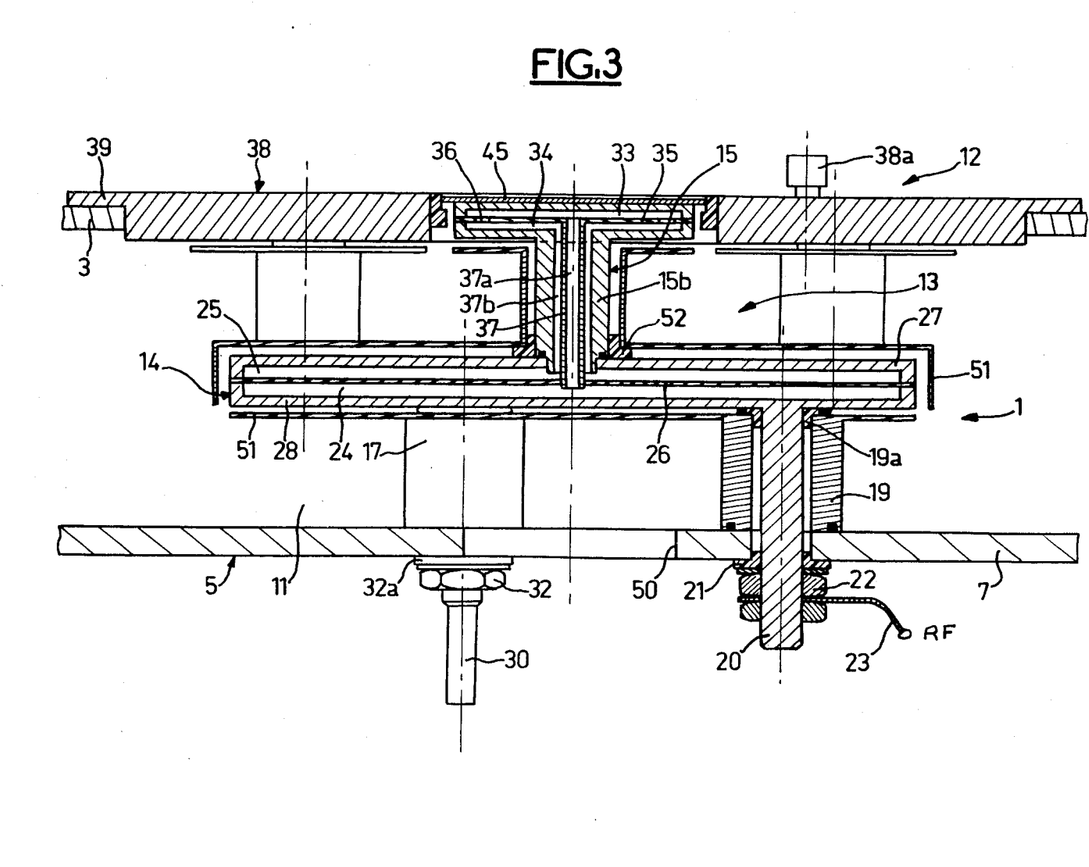
FIG. 3 shows an enlarged partial section along the line III—III in FIG. 2.

As can be seen in FIG. 3, the plate 14 has a projection 20 which extends downwards through the foot 19 and through the wall 7 of the cover 5, this projection 20 being electrically insulated from the foot 19 by means of the collar 19a and electrically insulated from the wall 7 of the cover 5 by means of an insulating collar 21. A nut 22 screwed onto the end of the projection 20 and resting on the collar 21 allows the plate to be fixed to the wall 7, compressing the foot 19. The end of an electrical wire 23 is also fixed to the end of the projection 20 and allows the electrode assembly 13 to be connected to a supply of alternating electrical energy not shown.

Figure 4:
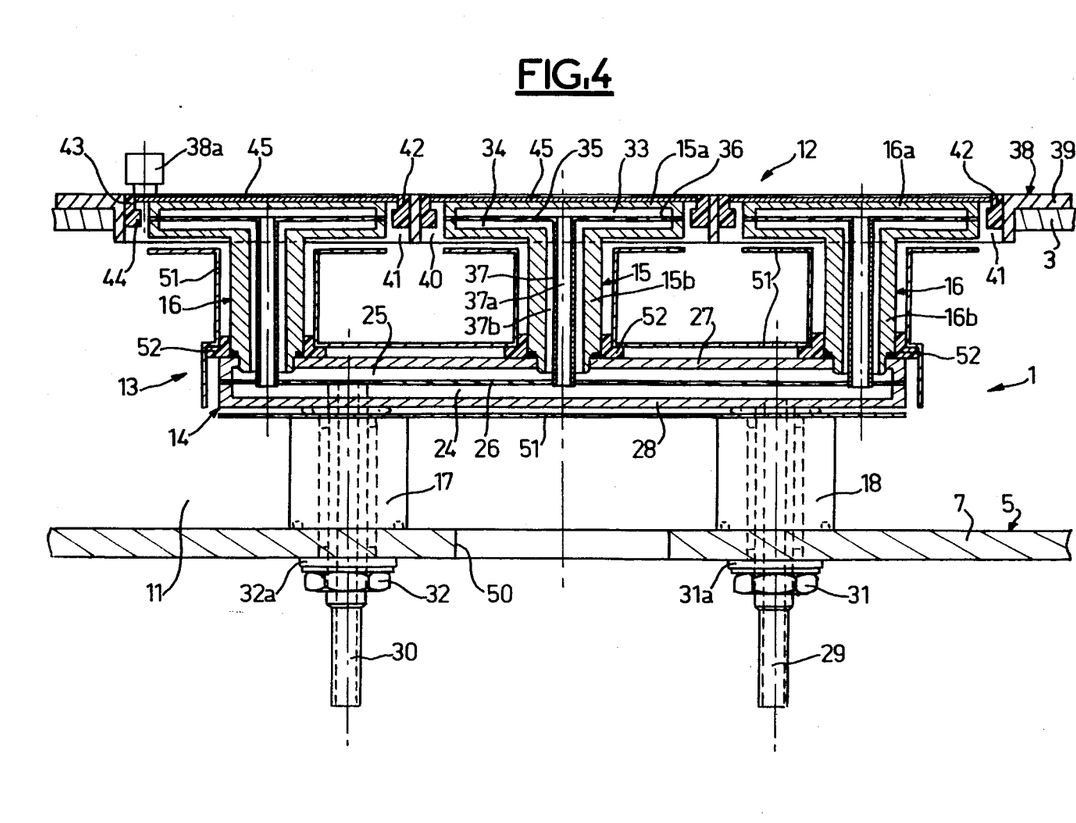
FIG. 4 shows an enlarged partial view of the section shown in FIG. 1.

As can be seen in particular in FIG. 3 and in FIG. 4, the plate 14 comprises two chambers 24 and 25 which are separated by a horizontal wall 26, the plate 14 having an upper wall 27 and a lower wall 28 which are located at a distance from the middle wall 26. In order to connect, in each case, the chambers 24 and 25 to a cooling circuit located outside the apparatus 1 (not shown), it can be seen that a pipe 29 has been provided, which extends through the foot 18 and through the wall 7 of the cover 5 and is fixed to the wall 28 of the plate 14, as well as a pipe 30 which extends through the foot 17, through the wall 7 of the cover 5 and through the chamber 24 of the plate 14 and is fixed to the middle wall 26.

In addition, the electrode assembly 13 is held and fixed by means of nuts 31 and 32 which are mounted on the end of the pipes 29 and 30, the pipes 29 and 30 being electrically insulated from the bottom 7 of the cover 5 in the same way as the projection 20, by means of insulating collars 31a and 32a.

The central electrode 15 and the six electrodes 16 which are arranged at its periphery have internal channels, the ends of which are connected, respectively, to the chambers 24 and 25 provided in the plate 14. The disk 15a of the electrode 15 comprises two chambers 33 and 34 which are separated by a horizontal partition 35 in which various communication orifices 36 are provided, the chambers 33 and 34 communicating, respectively, with the chambers 24 and 25 by means of two concentric passages 37a and 37b provided in the cylindrical part 15b of the electrode 15 and separated by a channel 37, the ends of which are fixed, in each case, to the partition 35 and the partition 26. Each of the peripheral electrodes 16 is similarly structured in such a way that the internal channels of the electrodes 15 and 16 are connected in parallel to the chambers 24 and 25 so as to allow the parallel flow of a cooling fluid, for example, introduced through the pipe 29 and discharged through the pipe 30.

The apparatus 1 also has a circular removable plate 38 which is engaged in the opening 4 of the ring 3 and has a flange 39 at its periphery which rests on the upper surface 3a of the ring 3 so as to be connected to ground. This removable plate 38 has a central through passage 40 as well as six through passages 41 into which the electrodes 15 and 16 extend, respectively, these passages 40 and 41 having a diameter greater than the diameter of the disks 15a and 16a of the electrodes 15 and 16 so as to provide annular spaces between these electrodes and the wall of the passages 40 and 41. The upper surface of the removable plate 38 extends substantially on the same level as the upper surfaces 15a and 16a of the electrodes 15 and 16.

Four plugs 42 are provided in each of the passages 40 and 41, these plugs 42 having, in each case, an arm 43 which extends upwards and a lower arm 44 which extends radially inwards and which forms a shoulder. The plugs 40 are formed in the space separating the lateral wall of the disks 15a and 16a of the electrodes 15 and 16 and the internal wall of the passages 40 and 41 and are made of an electrically insulating material.

In addition, the top of the plate 38 is provided with two knobs 38a which allow it to be gripped.

In order to load or unload the treatment apparatus 1, the following operations can be performed. With the removable plate 38 located outside the treatment vessel 2, a substrate 45 to be treated is arranged in each of the passages 40 and 41 of the said plate, the said substrate resting on the shoulders 44 of the plugs 42. With the bell-shaped cover 8 disassembled or lying open, the removable plate 38 is positioned in such a way that it engages inside the opening 4 of the ring 3 and around the electrodes 15 and 16. By so doing, the substrates 45 rest on the upper surface 15c and 16c of the electrodes 15 and 16, moving away from the shoulders 44 of the various plugs 42 and remaining centered in relation to the electrodes 15 and 16 on account of the vertical arms 43 of the plugs 42, an annular space thus remaining between the wall of the passages 40 and 41 of the plate 38 and the peripheral edge of the substrates 45.

In order to unload all of the substrates 45 arranged in the apparatus 1, the removable plate 38 need only be withdrawn, the substrates 45 again resting on the shoulders 44 of the plugs 42.

As can be seen in FIG. 1, the treatment apparatus 1 comprises an anode 46 which is connected to ground and is in the form of a plate carried by the wall 9 of the cover 8. This plate 46 extends in the upper part of the upper chamber 12 and substantially covers the zone of the electrodes 15 and 16, this plate 46 being fixed to the wall 9 of the upper cover 8. This anode plate 46 comprises an internal chamber 47 to which a central channel 48 is connected, which channel passes through the wall 9 of the cover 8 and can be connected to a reaction gas supply pipe, the plate 46 having, in addition, communication orifices 49 which allow the chamber 47 to be connected to the interior of the reaction vessel 2, these orifices 49 being formed, in each case, opposite the middle of each of the electrodes 15 and 16.

The wall 7 of the cover 5 has a large opening 50, by means of which the interior of the vessel 2 can be connected to a pump not shown in the Figures.

When the apparatus 1 operates, that is to say when the electrode assembly 13 is subjected to a supply of alternating energy via the electric wire 23 and projection 20 and when a reaction gas is introduced via the channel 48 and sucked in via the opening 50 by means of a pump, the reaction vessel being closed, the reaction gas flows through the channel 48 leading to the internal chamber 47 of the electrode 46, is introduced into the upper chamber 12 via the communication orifices 49, above each of the electrodes 15 and 16, spreads into the chamber 12, flows through the annular spaces provided between the edge of the substrates 45 and the lateral walls of the parts 15a and 16a of the electrodes 15 and 16 and the walls of the through passages 40 and 41 of the removable plate 38, then passes through the lower chamber 11 and is discharged via the opening 50 in the wall 7 of the cover 5. As the removable plate 38 is connected to ground, the plasma consequently ignites only above the substrates 45 carried by the electrodes 15 and 16.

Moreover, in order to prevent the plasma igniting inside the lower chamber 11, walls 51 have been provided around the plate 14, around the cylindrical parts 15b and 16b of the electrodes 15 and 16 and below the disks 15a and 15b of these electrodes, which walls form a screen and are located close to the plate 14 and the electrodes 15 and 16 and are electrically insulated from the latter by means of collars 52 consisting of an insulating material.

It is evident from the preceding description that the substrates 45 arranged, in each case, on the electrodes 15 and 16 are subjected substantially to the same treatment conditions. On the one hand, they are each treated with a separate flow of gas which spreads from each of the orifices 49 located opposite the middle of each of the electrodes 15 and 16 and flows to their periphery, the plasma being formed only in the zone required for treating the substrates 45, in such a way that the amount of useful electrical energy is limited. On the other hand, as the electrodes 15 and 16 are cooled, in each case, by means of internal channels connected in parallel to a cooling circuit, they are all kept substantially at the same temperature.

It can also be noted that, by adjusting the vertical position of the removable plate 38 which is connected to ground and which surrounds the electrodes 15 and 16 or by adjusting the vertical position of anode plate 46 by means of which the reaction gas is introduced, it is possible to modify the plasma formed.

In addition, as a result of the removable plate 38, it is possible to load and unload all of the substrates 45 in a single operation in such a way that a high treatment speed can be achieved using the treatment apparatus 1, for example by using several identical removable plates.

Another advantage of the treatment apparatus 1 lies in the fact that, since the plasma is formed between the anode consisting of the plate 46, this plate 46 can be cooled and consequently it is not necessary to cool the walls forming the treatment vessel 2.

Figure 5:
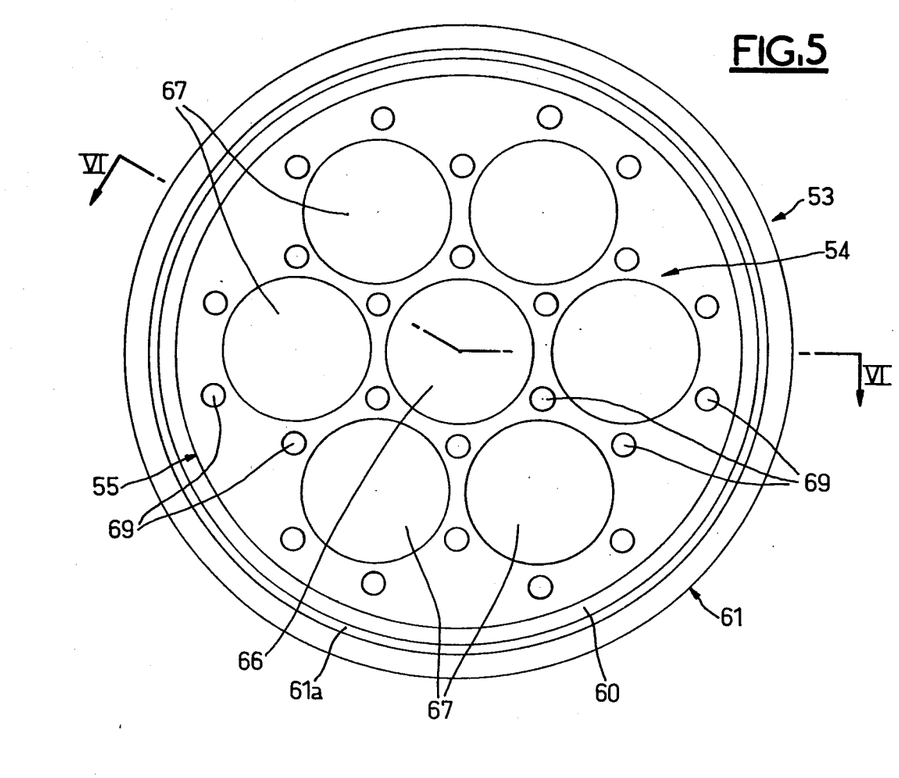
FIG. 5 shows a plan view of the bottom part, with the plate removed, of a second treatment apparatus.
Figure 6:
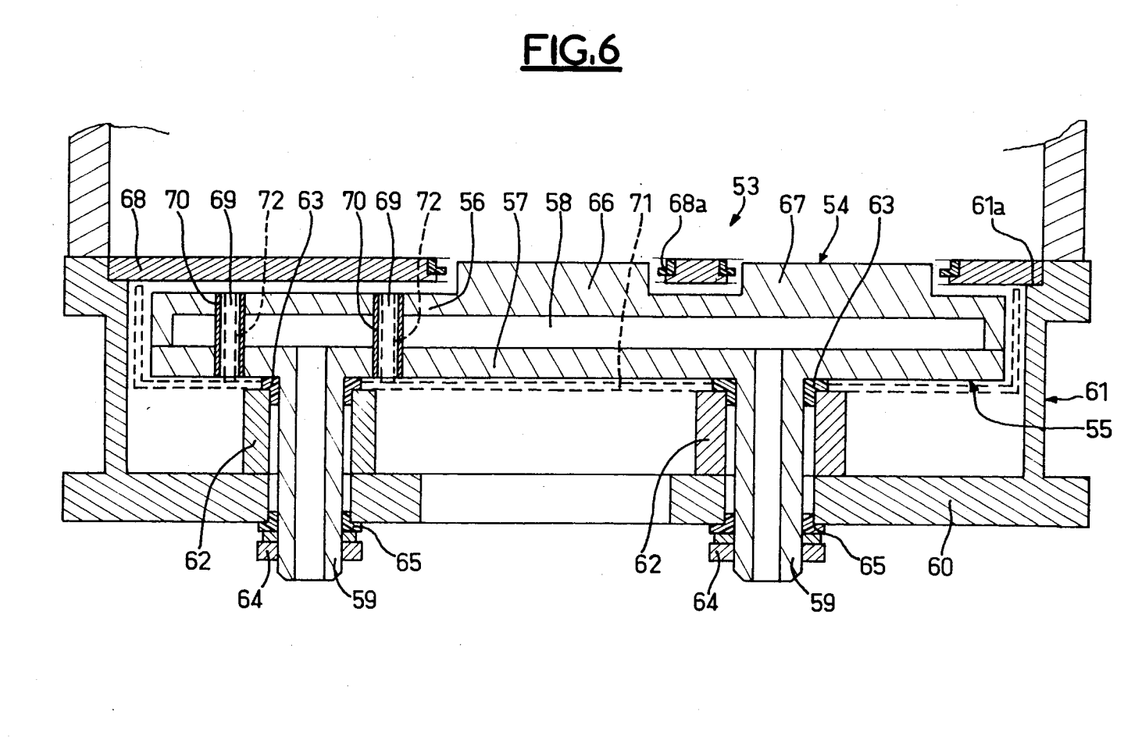
FIG. 6 shows a section, along the line VI—VI, of the treatment apparatus shown in FIG. 5, with the plate assembled.

With reference to FIGS. 5 and 6, a description is now given of a plasma treatment apparatus, indicated generally by the reference number 53, which operates and can be used in the same manner as the above-described treatment apparatus 1 shown in FIGS. 1 to 4 and which differs from the latter essentially with respect to the structure of its electrode assembly, indicated generally by the reference number 54, which corresponds to the electrode assembly 13 of the treatment apparatus 1.

The electrode assembly 54 of the treatment apparatus 53 comprises a horizontal plate 55 consisting of two disk-shaped parts 56 and 57 which delimit between them a chamber 58 and which are fixed to each other.

The lower disk-shaped part 57 of the plate 55 has pipes 59 which extend downwards and which pass through the lower wall 60 of the cover 61 of the treatment apparatus 53. A fluid for cooling or maintaining the temperature of the plate 55 is able to circulate inside the plate 55 by means of these pipes 59, some of which serve to supply the cooling fluid and others of which serve to discharge it.

In order to fix the plate 55 to the cover 61, at a distance from its internal walls, sleeves 62 are provided, which surround the pipes 59 at a distance, which rest on the wall 60 of the cover 61 and on which the part 57 of the plate 55 rests by means of collars 63 made of insulating material. Screws 64 are screwed onto the ends of the pipes 59, outside of the lower wall 60 of the cover 61, and rest on the external surface of the lower wall 60 by means of collars 65 made of an insulating material. Consequently, as a result of the collars 63 and 65, the plate 55 of the electrode assembly 54 is completely insulated from the vessel 61.

In order to supply the plate 55 with electrical energy, it is also advantageously possible to provide a projection equivalent to the projection 20 provided in the treatment apparatus shown in FIGS. 1 to 4, which projection is also electrically insulated from the cover 61.

In the example shown, the disk-shaped part 56 of the plate 55 of the treatment apparatus 53 has, projecting upwards, an upward part, a central part 66 and six peripheral parts 67 which have a circular cross-section and which are ranged at regular intervals with respect to each other. The upper surfaces of these parts 66 and 67, which are in the same plane, form surfaces for receiving disk-shaped substrates.

As can be seen in FIG. 6, the treatment apparatus 53 comprises a removable plate 68 with the same structure as that of the removable plate 38 of the treatment apparatus 1 shown in FIGS. 1 to 4. As in the previous example, this plate 68 is able to rest, at its periphery, on a shoulder 61a of the cover 61 and is electrically connected there and comprises seven through passages, corresponding to the projecting parts 66 and 67 of the plate 55, in which plugs 68a made of an insulating material are provided for transporting and holding the substrates. In the assembled position, the removable plate 68 extends at a distance from the upper surface of the disk-shaped part 56 of the plate 55 and at a distance from the lateral walls of the projecting parts 66 and 67 of this plate 55 in such a way that it is electrically insulated from the latter.

So that the reaction gas is able to flow through the plate 55 after passing through the flow spaces separating the projecting parts 66 and 67 of the plate 55 and the walls of the passages provided in the removable plate 68, a plurality of channels 69 have been provided, as can be seen in particular in FIG. 5, which pass through the plate 55 in the axial direction and the internal walls of which are formed by cylindrical distancing sleeves 70 which join together the disk-shaped parts 56 and 57 and which pass through the chamber 58. In the example shown, the plate 55 comprises six passages 69 distributed around each of the projecting parts 66 and 67 of the plate 55 and located close to these projecting parts. In this way, uniform flow of the reaction gas can be ensured.

With reference to FIG. 6, it can be seen that provision has also been made for a diffuser screen 71 with a large number of perforations (not shown in the Figure), this diffuser screen 71 extending at a distance from the lower surface of the disk 57 of the plate 55 as well as around and at a distance from the lateral wall of the latter, in the space separating this lateral wall from the cover 61, and being electrically connected to the cover 61. This diffuser screen 71 could, in addition, carry cylindrical screens 72 extending inside the passages 69, at a distance from their internal walls, as far as their upper parts.

The present invention is not limited to the examples described above. A large number of variations is possible without going outside the scope defined by the attached claims.

I claim:

1. Apparatus for the plasma treatment of disk-shaped substrates (45), comprising a reaction vessel (2) which has supply means (38) and discharge means (50) for a reaction gas, at least one first electrode, forming an anode (46), which is provided in the said vessel and is designed to be connected to a reference potential and, located in the said vessel, a plurality of second electrodes, forming cathodes, which are electrically insulated from the said first electrode and are designed to be connected to an alternating electrical energy source and have, in each case, a surface for receiving at least one substrate located on the same side as the said first electrode, so that a plasma can be formed between the said first electrode and the said second electrodes with a view to treating the substrates carried by the second electrodes, and additionally comprising at least one plate (38) which has a plurality of through passages (40, 41) formed so as to correspond, in each case, to at least one part of the said second electrodes (15, 16) and designed so that the walls of these passages (40, 41) extend, in each case, at the periphery of and at a distance from the peripheral walls of the corresponding second electrodes (15, 16) in such a way that reaction gas flow passages are provided, in each case, between the walls of the said through passages (40, 41) of the said plate (38) and the peripheral walls of the said second electrodes (15, 16).

2. Treatment apparatus as claimed in claim 1, wherein the said plate (38) is electrically insulated from the said second electrodes (15, 16).

3. Treatment apparatus as claimed in claim 1, wherein the said plate (38) is at a reference potential.

4. Treatment apparatus as claimed in claim 1, wherein the said plate (38), together with the receiving surfaces of the said second electrodes (15, 16), divide the said reaction vessel (2) into two chambers (11, 12) which communicate with each other via the said flow spaces.

5. Treatment apparatus as claimed in claim 1, wherein the said cathodes (15, 16) are provided with internal channels inside which a cooling fluid is able to flow.

6. Treatment apparatus as claimed in claim 1, wherein the ends of the said second electrodes (15, 16), opposite to the receiving surfaces (15c, 16c) of the latter, are connected to each other by a plate (14).

7. Treatment apparatus as claimed in any one of the preceding claims, wherein the said second electrodes (66, 67) are formed, in projecting fashion, on a plate (55) which has a plurality of through channels (69) distributed around the said second electrodes in projecting fashion so that the gases are able to flow through this plate (55).

8. Treatment apparatus as claimed in claim 7, wherein the lower part of the said plate (55) is surrounded at a distance by a diffuser screen (71) which carries cylindrical screens (72) extending inside the said through channels (69) of the said plate (55) at a distance from their walls.

9. Treatment apparatus as claimed in claim 1, wherein the said plate (14) carrying the said second electrodes (15, 16) is provided with at least one internal channel in which a cooling fluid is able to flow.

10. Treatment apparatus as claimed in claim 1, wherein screens electrically insulated from the said second electrodes are provided around the parts of the latter which extend below their substrate-receiving surfaces (15c, 16c).

11. Treatment apparatus according to claim 1, wherein screens electrically insulated from the said second electrodes are provided around the plate (14) carrying these second electrodes (15, 16).

12. Treatment apparatus as claimed in claim 10, wherein the said screens are at a reference potential.

13. Treatment apparatus as claimed in claim 1, wherein the said first electrode (46) is formed by a plate extending opposite to and at a distance from the receiving surfaces of the said second electrodes (15, 16), the said reaction gas supply means comprising at least one chamber (47) formed inside this first electrode and orifices (49) for connecting this lower chamber to the interior of the said reaction vessel, which orifices are located in the middle of the said second electrodes.

14. Treatment apparatus as claimed in claim 1, wherein the said plate (38) which has a plurality of through passages (40, 41) is removable and is provided with means (42) for holding, in each case, substrates inside the said passages and at a distance from their walls, this plate (38) being designed so as to be arranged or mounted in the said reaction vessel (2) in such a way that the substrates which it carries come to rest on the substrate-receiving surfaces of the said corresponding second electrodes.

15. Treatment apparatus as claimed in claim 14, wherein the said means for holding the substrates in the said through passages of the said removable plate (38) consist of plugs (42) which form supports for the substrates and keep these substrates at a distance from the walls of the said through passages.

16. Treatment apparatus as claimed in claim 14, wherein the said means for carrying and holding the substrates in the through passages of the said removable plate (38) are made of an insulating material.

17. Treatment apparatus as claimed in claim 15, wherein the said means for carrying and holding the substrates in the through passages of the said removable plate (38) are made of an insulating material.

* * * * *